United States Patent [19]

Miller

[11] E Re. 30,095

[45] Reissued Sep. 11, 1979

[54] DISPLAY PANEL USING GLOW SPREADING PRINCIPLES

[75] Inventor: Donald E. Miller, Stockton, N.J.

[73] Assignee: Burroughs Corporation, Detroit, Mich.

[21] Appl. No.: 845,104

[22] Filed: Oct. 25, 1977

Related U.S. Patent Documents

Reissue of:

[64] Patent No.: 3,978,371
Issued: Aug. 31, 1976
Appl. No.: 569,222
Filed: Apr. 18, 1975

U.S. Applications:

[63] Continuation of Ser. No. 448,551, Mar. 6, 1974, abandoned.

[51] Int. Cl.[2] ..... G09F 9/00; H01J 61/10

[52] U.S. Cl. ..... 340/714; 313/190; 315/169.2; 340/753; 340/769

[58] Field of Search ..... 313/188, 190, 210, 220, 313/514, 517; 315/169 R, 169 TV, 169.2; 340/714, 753, 769

[56] References Cited

U.S. PATENT DOCUMENTS

| | | | |
|---|---|---|---|
| 3,626,235 | 12/1971 | Kupsky | 315/169 TV X |
| 3,798,502 | 3/1974 | Ngo | 315/169 TV |
| 3,885,195 | 5/1975 | Amano | 315/169 TV |

*Primary Examiner*—Eugene R. La Roche
*Attorney, Agent, or Firm*—Robert A. Green

[57] ABSTRACT

A display panel includes a series of linear conductive elements, operable as glow cathodes, and separated into first and second portions by means of an insulating barrier extending along and overlaying the series of cathodes. A first anode is disposed adjacent to the series of cathodes and is operable with the first portions thereof in a scanning operation wherein each such portion of each cathode is energized in turn. A second anode is disposed in operative relation with the second portions of the cathodes and is adapted to be energized at selected times during the operation of the first portions of the cathodes to cause glow to spread from glowing first portions to the associated selected second portions.

41 Claims, 3 Drawing Figures

DISPLAY PANEL USING GLOW SPREADING PRINCIPLES

Matter enclosed in heavy brackets [ ] appears in the original patent but forms no part of this reissue specification; matter printed in italics indicates the additions made by reissue.

CROSS REFERENCE TO RELATED APPLICATIONS

This application is a continuation of application Ser. No. 448,551, filed Mar. 6, 1974, now abandoned.

BACKGROUND OF THE INVENTION

A display device known as a bar graph is described and claimed in copending application Ser. No. 428,126, filed Dec. 26, 1973, now abandoned. This device includes a series of cathodes which can be caused to glow to represent a bar of light, the length of which is a visual representation of an analog signal. This device operates satisfactorily; however, it cannot be operated, like the device described herein, to display individual selected bars of light along a series of such bars in accordance with input information signals. In addition, the device described herein operates in a different manner than that described in the above application, and the principles of this different mode of operation provide improved flexibility and utility.

SUMMARY OF THE INVENTION

Briefly, a display panel embodying the invention includes a plurality of cathode electrodes, first portions of which can be energized by operation with a first anode, and second portions of which can be energized by operation with a second anode. This principle of operation can be used in various ways to provide desired displays of information.

DESCRIPTION OF THE PREFERRED EMBODIMENTS

Figure 1:
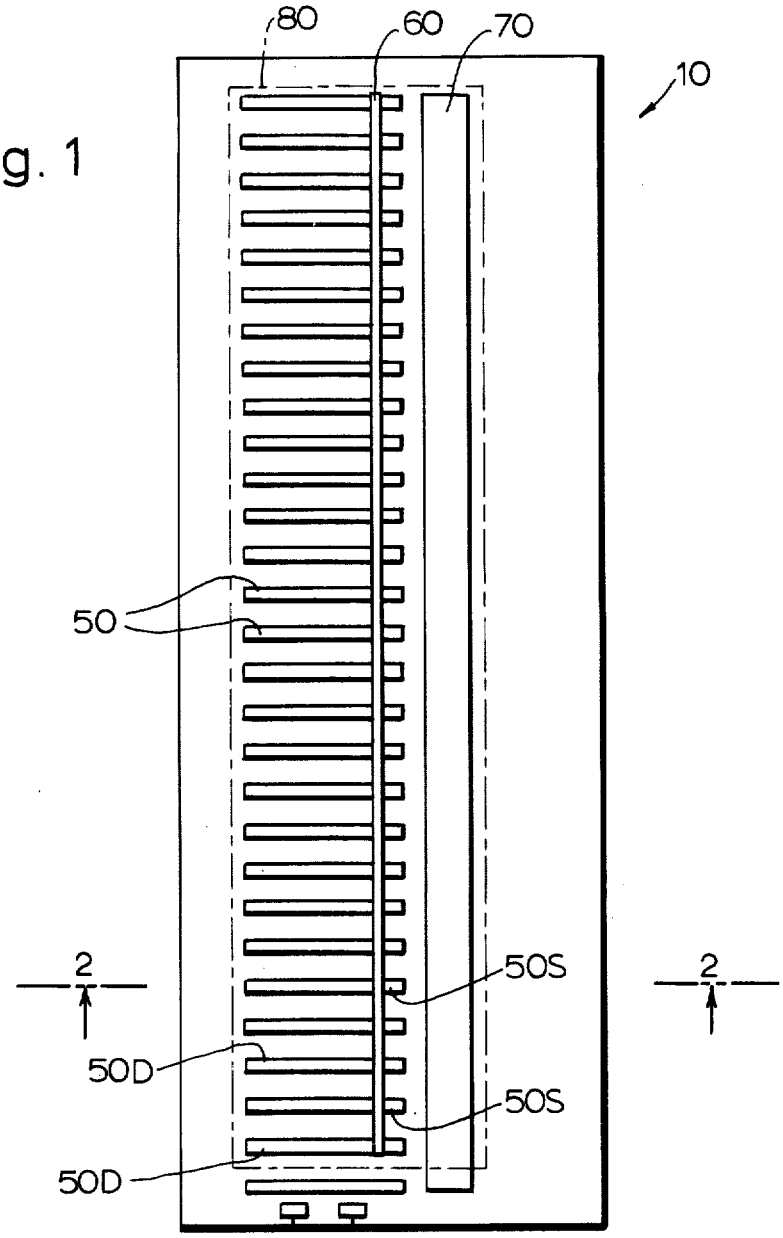
FIG. 1 is a plan view of a display panel illustrating one embodiment of the invention.
Figure 2:
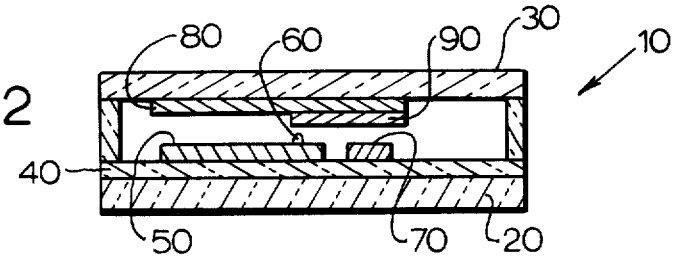
FIG. 2 is a sectional view, along the lines 2—2 in FIG. 1.

A display device 10 embodying the invention is shown in FIGS. 1 and 2 and includes a gas-filled envelope made up of a base plate 20 and a face plate 30, both of insulating material such as glass, and hermetically sealed together along a perimeter to provide a gas-tight enclosure which is filled with a suitable ionizable gas. The base plate 20 is coated with a layer 40 of an insulating material, preferably a black material to provide visual contrast, and a series of parallel linear electrodes 50, to be operated as glow cathodes, are formed on the insulating layer. A thin line of insulating material 60, such as glass or the like, is formed along the line of cathode elements to, in effect, divide these elements into two portions 50S or 50D, with portions 50S being as small as possible, for optimum power economy, as will be clear to those skilled in the art. A reset cathode 50R is provided adjacent to the first cathode 50, preferably portion 50S, in the series, and keep-alive anode 51 and cathode 53 are provided adjacent to the reset cathode 50R.

An electrode 70, to be used as an anode and generally in the form of a narrow linear strip, is formed on the insulating layer 40 adjacent to the portions 50S of the cathodes 50. A second anode electrode 80 in the form of a transparent conductive film, of tin oxide or the like, is formed on the lower surface of the face plate 30 overlying and in operative relation only with all of the second portions 50D of the cathodes. An opaque film or layer 90 is also formed on the inner surface of the face plate, on the anode 80 and overlaying the cathode 50S so that they cannot be seen by a viewer. The keep-alive electrodes 51 and 53 are also positioned, under the opaque layer 90, so that they are hidden from view.

The opaque layer 90 may be made of an insulating material, but it is preferably a metal film if the anode 80 is made of tin oxide in order to minimize the resistance of the anode film.

In the panel 10, the gas filling is preferably a Penning mixture, such as neon and xenon, and it is provided at a pressure of about 400 to 600 Torr. In addition, the face plate and base plate are spaced apart a distance of about 20 to 25 mils. These parameters are properly selected to achieve the desired cathode glow operation to be described.

All of the layers and electrodes, except perhaps anode 80, may be formed by a screen printing process, as is now well known in the art.

Figure 3:
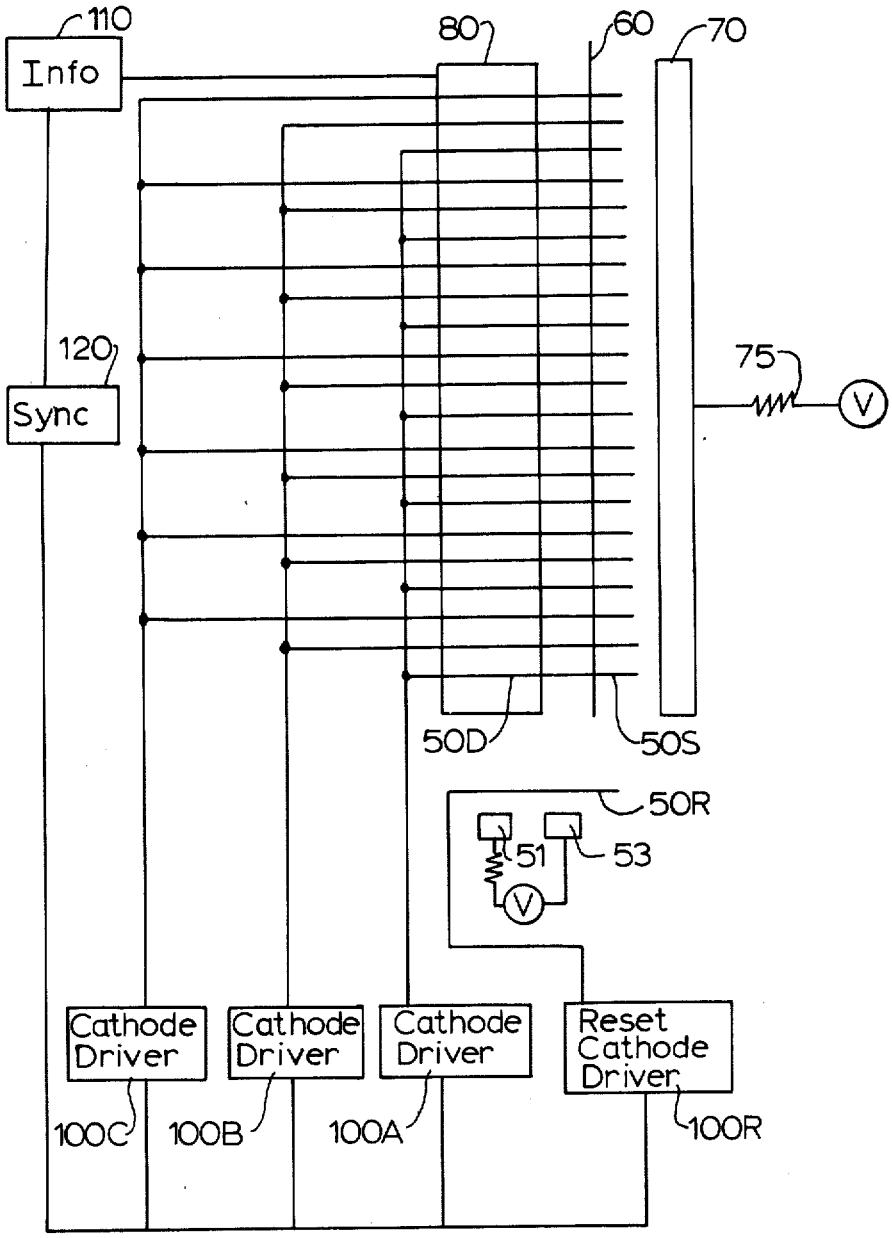
FIG. 3 is a schematic representation of the panel of FIG. 1 and a circuit in which it may be operated.

In operation of panel 10, the first cathode portions 50S are operated with anode 70 which lies adjacent thereto, and they are driven as scanning cathodes, that is, they are turned on one at a time beginning with the first in the series. The first scanning cathode 50S is considered to be the one which lies adjacent to the reset cathode 50R. For circuit economies, the cathodes 50 are connected in groups or phases, for example, in three groups, with every fourth cathode being in the same group, as illustrated schematically in FIG. 3. Each group of cathodes 50 and reset cathode 50R are connected to a separate cathode driver 100, and the anode 70 is connected to a source of positive potential V through a current-limiting resistive path 75. The keep-alive electrodes 51 and 53 are also connected to a suitable power source through a suitable resistive path, as is well known in the art, to provide a constant source of excited particles. The anode 80 is connected to a source of information signals represented by block 110 and including all necessary circuit elements for the operation to be described. Suitable synchronization circuits 120 are also provided to inter-relate the operation of the cathodes 50 and anode 80.

In operation, first the reset cathode 50R is energized so that it glows and provides excited particles for the first scanning cathode 50S in the series. The cathodes 50S are then energized sequentially and in turn beginning with the first cathode in the series. It is noted that the gas pressure and base plate-to-face plate spacing are designed so that only one cathode glows at a time and glow transfers properly from cathode 50S to cathode 50S along the series, even though the cathodes are connected together in groups.

As the series of scanning cathodes 50S are energized, only the cathodes 50S exhibit cathode glow since the insulating line 60 and the position of the anode 70 adjacent to these cathode portions prevent glow from appearing on the display portions 50D of the cathodes. However, during the scanning operation and in accordance with the application of information signals from source 110 to anode 80, when the anode 80 is energized, glow spreads from the associated scanning cathode 50S across the insulating line 60 to the display cathode portion 50D.

This operation is repeated through the series of cathodes sequentially and at such a rate that selected display cathodes 50D appear to glow steadily, but the display cathode(s) which glow are changeable in accordance with input information from source 110. The display cathode or cathodes which glow can provide a digital representation of an input analog signal and can represent speed, meter movement, or the like.

Typical dimensions for parts of a panel 10 having a gas pressure of about 400 Torr and a base plate-to-face plate spacing of about 20 mils include the following:

Length of cathodes 50S is 20 mils;

Length of cathodes 50D is 100 mils;

Length of anode 70 is 10 mils;

Spacing between anode 70 and cathodes 50S is 15 mils.

Those skilled in the art will appreciate that modifications may be made in panel 10 within the scope of the invention, to use the principles of cathode glow-spreading described above. For example, it is clear that the electrodes need not be disposed in a linear array, but could, for example, be in a circular array. In addition, the various dimensions and gas pressures may be varied in accordance with the teaching herein and well-known principles. In addition, cathode portions 50S and 50D may be operated with only anode 70, with glow being caused to spread from a cathode 50S to a cathode 50D by increasing the current flow at selected instants.

What is claimed is:

1. A display device comprising a gas-filled envelope including a viewing window, a glow cathode disposed within said envelope and having a surface exposed to said gas in said envelope and facing said viewing window, divider means extending across the surface of said cathode and dividing the surface of said cathode into first and second portions, said divider comprising a barrier between said first and second portions, said second portion of said cathode comprising a display cathode and being visible through said viewing window, said first portion being obstructed from view, and an anode electrode for said cathode positioned adjacent to said cathode and positioned closer to said first portion than said second portion, there being an open current flow path from said anode to the entire surface of said cathode, said path extending directly from said anode to said first portion and across said divider means to said second portion, said anode and cathode including terminal means whereby said anode and cathode can be connected in a circuit, said circuit being operable at a first level of current flow between said anode and said cathode at which only said first portion of said cathode exhibits cathode glow and operable at a higher level of current flow at which cathode glow spreads across said divider means from said first portion of said cathode to said second portion of said cathode.

2. The device defined in claim 1 wherein said divider means comprises insulating material.

3. The device defined in claim 1 wherein said divider means comprises a line of insulating material disposed across the surface of said cathode.

4. The device defined in claim 1 wherein said cathode is generally rectangular in form and has a long axis, and said divider means comprises a line of insulating material disposed across the surface of said cathode transverse to said long axis thereof.

5. A display device comprising a gas-filled envelope made up of a base plate and a face plate, said face plate having a viewing window, a series of coplanar line-like glow cathodes disposed on said base plate with each cathode having its upper surface exposed to said gas in said envelope and facing said viewing window, divider means extending across said base plate and across the surfaces of said cathodes and dividing the surfaces of said cathodes into first and second portions, said divider means comprising a barrier between each first portion and each second portion of each cathode, all of said first portions being aligned along said series and all of said second portions being aligned along said series, an anode electrode for said cathodes positioned adjacent to said series of cathodes, positioned closer to said first portions than said second portions, there being an open current flow path from said anode to the entire surface of each of said cathodes, said path extending directly from said anode to each said first portion and across said divider means to each said second portion, said anode and cathodes including terminal means whereby said anode and cathodes can be connected in a circuit, said circuit being operable at a first level of current flow between said anode and said cathodes at which only said first portion of a cathode exhibits cathode glow and operable at a higher level of current flow at which cathode glow spreads across said divider means from a first portion of a cathode to the second portion of said cathode.

6. The device defined in claim 5 wherein said anode electrode is disposed on said base plate, generally coplanar with said cathodes, and extends along said series of cathodes adjacent to said first portions thereof.

7. The device defined in claim 5 wherein said anode electrode is linear in form and is disposed on said base plate, generally coplanar with said cathodes, and extends along said line of cathodes adjacent to said first portions thereof.

8. The device defined in claim 5 wherein said cathodes are generally rectangular in shape, with their long axes parallel to each other, and said divider means is a line of insulating material disposed across said cathodes transverse to the long axes thereof and dividing the surfaces of said cathodes into said first and second portions.

9. A display device comprising a gas-filled envelope made up of a base plate and a face plate, a series of parallel line-like glow cathodes disposed on said base plate with each cathode having a surface exposed to said gas in said envelope, divider means on the surface of the cathodes dividing the surfaces of said cathodes into first and second portions, all of said first portions being aligned along said series and all of said second portions being aligned along said series, a linear anode electrode for said series of cathodes disposed adjacent to said series of cathodes and positioned closer to said first portions than said second portions whereby, at a first relatively low level of current flow between said anode and said cathodes, only said first portions of said cathodes will exhibit cathode glow, and, at a higher level of current flow, cathode glow will spread from said first portions of said cathodes to said second portions of said cathodes.

10. The device defined in claim 9 wherein said divider means is a line of insulating material disposed across the surfaces of said cathodes transverse to the direction in which said series extends and forming said first and second portions of said cathodes.

11. A display device comprising a gas-filled envelope, a glow cathode in said envelope and having a surface exposed to said gas in said envelope, insulating means dividing the surface of said cathode into first and second portions which are electrically and mechanically unitary, a first anode electrode adjacent to said cathode and positioned closer to said first portion than said second portion whereby, at a first level of current flow between said anode and said cathode, only said first portion of said cathode will exhibit cathode glow, and a second anode electrode in operative relation with said second portion of said cathode for causing glow to spread from said first portion of said cathode to said second portion of said cathode.

12. A display device comprising a gas-filled envelope made up of a base plate and a face plate, a series of parallel line-like glow cathodes disposed on said base plate with each cathode having a surface exposed to said gas in said envelope, insulating means dividing the surface of said cathodes into first and second portions, all of said first portions being aligned along said series and all of said second portions being aligned along said series, a first anode electrode disposed adjacent to said series of cathodes and positioned closer to said first portions than said second portions whereby, at a first level of current flow between said anode and said cathodes, only said first portions of said cathodes will exhibit cathode glow, and a second anode electrode in operative relation with said second portions of said cathodes and operable therewith to cause cathode glow to spread from first portions of said cathodes to second portions thereof.

13. The device defined in claim 12 wherein said first anode electrode is disposed on said base plate and extends along said line of cathodes adjacent to said first portions thereof.

14. The device defined in claim 12 wherein said first anode electrode is linear in form and is disposed on said base plate and extends along said line of cathodes adjacent to said first portions thereof.

15. The device defined in claim 12 wherein said insulating means is a line of insulating material disposed across said cathodes and extending transverse to said series and forming said first and second portions of said cathodes.

16. The devide defined in claim 12 wherein said first anode electrode is linear in form and is disposed on said base plate and extends along said line of cathodes adjacent to said first portions thereof, and said second anode electrode is disposed in operative relationship with said second portions of said cathodes.

17. The device defined in claim 12 wherein said first anode electrode is linear in form and is disposed on said base plate and extends along said line of cathodes adjacent to said first portions thereof, and said second anode is disposed on the inner surface of said face plate overlying said second portions of said cathodes.

18. A display device comprising a gas-filled envelope including a viewing window, a glow cathode disposed within said envelope and having a surface exposed to the gas in said envelope and facing said viewing window, means extending across the surface of said cathode and dividing the surface of said cathode into first and second glow portions, each of which can exhibit cathode glow separately, said means forming a barrier between said first and second glow portions, and anode means associated with said cathode electrode, positioned closer to said first glow portion than said second portion, and operable in a first mode to cause said first portion of said cathode to exhibit cathode glow, and operable in a second mode to cause cathode glow to spread from said first portion of said cathode across said dividing means to said second portion of said cathode.

19. A display device comprising a gas-filled envelope including a base plate and a face plate hermetically sealed together, said face plate having a viewing window, a plurality of coplanar cathode electrode pairs disposed in a series within said envelope, each pair comprising a first glow priming cathode and a second display cathode, insulating means providing a physical barrier between the two cathodes of each pair in the series, and anode electrode means adjacent to said series of cathode pairs for causing each priming cathode of each pair to glow in turn along said series and for causing cathode glow to spread across said insulating means to selected display cathodes.

20. The device defined in claim 19 wherein said anode means includes a first anode electrode adjacent to said first cathodes and a second anode electrode adjacent to said second cathodes.

21. The panel defined in claim 19 and including opaque means for rendering cathode priming glow at a first cathode invisible to a viewer.

22. The device defined in claim 19 wherein the cathodes of each pair are connected together electrically.

23. The device defined in claim 19 wherein said anode means comprises an elongated anode electrode which extends along said series of cathode pairs and lies closer to said first cathodes than said second cathodes.

24. The device defined in claim 19 wherein said insulating means comprises a narrow line-like length of insulating material which extends along said base plate between each cathode of each pair of cathodes.

25. The device defined in claim 24 and including means for energizing said anode electrode and each of said cathode electrode pairs to cause priming cathode in turn to exhibit cathode glow, said means also being operable to spread cathode glow from a first cathode to a selected second cathode in response to applied electrical information signals.

26. A display panel comprising a gas-filled envelope including a base plate and a face plate having a viewing window, a series of cathode electrode pairs supported on said base plate and facing said viewing window, each pair comprising a first cathode and a second cathode, said first cathode electrodes being arrayed in a row and said second cathodes being arrayed in a row, a barrier between each first cathode and each second cathode of said cathode electrode pairs, and a separate anode electrode for each row of first cathodes and for each row of second cathodes.

27. The panel defined in claim 26 wherein said barrier is an insulating means separating the electrode pairs from each other and defining the rows of electrode pairs, said insulating means also providing a separation between the cathodes of each pair of cathodes in the rows of first and second cathodes.

28. The panel defined in claim 26 and including means preventing said first cathodes from being seen through said viewing window.

29. The panel defined in claim 26 wherein the cathodes of each pair are electrically connected.

30. The panel defined in claim 26 wherein each first cathode and its associated anode comprise a glow priming cell, there thus being columns of glow priming cells, and each second cathode and its anode comprise a display cell, there thus being columns of display cells, means for producing a priming glow discharge in all of the glow priming cells, of a column of such glow priming cells, and then in all of the cells of the remaining glow priming cell columns, one column after the next, to scan the glow priming cells, and means for applying each of a succession of groups of information signals selectively to said columns of display cells, in synchronism with the scanning of the columns of glow priming cells to produce display glow discharges in selected display cells.

*31. A gaseous discharge bar graph display comprising*

*an envelope having a viewing window and containing an ionizable gas,*

*an array of successive glow cathodes disposed along a surface within said envelope and facing said viewing window,*

*each of said cathodes having a scan area and a display area on its surface, said scan area and display area being separated by a mechanical divider on the surface of the cathode which acts to inhibit glow transfer from the scan area to the display area,*

*the scan area of each such cathode being small in comparison to the display area,*

*the scan areas of the successive cathodes being aligned and each scan area being in gas communication and glow priming relationship with its associated display area and with the scan area of the next succeeding cathode, so that each scan area, when it glows, primes its associated display area and the scan area of the next succeeding cathode,*

*scanning means for scanning the scan areas of said cathodes one after another, from one end of the array toward the other, and*

*display means for producing a glow discharge along the surface of a selected one of said display areas, at a selected distance from said one end of the array, to represent by such distance a parameter of an input signal being received,*

*said scanning means including first conductor means connected to said cathodes for energizing successive ones of said cathodes one after another, beginning at said one end of the array, and causing each such cathode in turn to exhibit a glow discharge over its scan area,*

*said display means including an anode electrode means in operative glow discharge relationship with each of said cathodes and a second conductor means connected to said anode electrode means to increase the current flow therethrough when the scanning of the scan areas reaches said selected cathode.*

*32. A bar graph display as in claim 31 wherein the cathodes constitute strips of conductive material extending transversely to the direction of the scan.*

*33. A bar graph display as in claim 31 wherein the current flow through the display area of the selected cathode is substantially uniform during the period of time it is present.*

*34. A bar graph display as in claim 33 wherein the surface divider on each cathode comprises insulating material disposed on the cathode between its scan and display areas.*

*35. A bar graph display as in claim 34 wherein the insulating material disposed on each cathode, between its scan and display areas, extends across substantially the entire width of the cathode, but is low enough to permit glow transfer from the scan areas to the display area in the case of the selected cathode.*

*36. A bar graph display as in claim 35 wherein the anode electrode means includes a transparent anode extending along the interior surface of the face plate throughout the length of the array, and the space between the base plate and the face plate is otherwise open along the length of the array.*

*37. A bar graph display as in claim 31 wherein said anode means includes a display anode which extends along the length of the cathodes in operative glow discharge relationship with the display areas of the respective cathodes, and a scan anode which extends along the scan anodes in glow discharge relationship with the scan areas of such cathodes.*

*38. A bar graph display as in claim 37 wherein the display anode constitutes a transparent conductor disposed between the display areas of respective cathodes and the viewing window, and the scan anode is mounted on the surface that supports the cathodes.*

*39. A gaseous discharge bar graph display panel comprising*

*an envelope formed of a face plate having a viewing window and a base plate closely spaced thereto,*

*an ionizable gas within said envelope,*

*an array of glow cathodes disposed along the interior surface of the base plate facing said viewing window,*

*each of said cathodes having a small scan area and a larger display area on its surface, with a surface divider between said scan and display areas,*

*the scan areas of the successive cathodes being aligned with one another, all on one side of said surface divider, and the display areas being aligned with one another on the other side,*

*each scan area being in gas communication and glow priming relationship with its associated display area and with the scan area of the next succeeding cathode, so that each scan area, when it glows, primes its associ-*

*ated display area and the scan area of the next succeeding cathode,*

*scanning means for scanning the scan areas of said cathodes one after another, from one end of the array toward the other, and*

*display means for producing a glow discharge along the surface of a selected one of said display areas, at a selected distance from said one end of the array, to represent by such distance a parameter of an input signal being received,*

*said scanning means including first conductor means connected to said cathodes for energizing successive ones of said cathodes one after another, beginning at said one end of the array, and causing each such cathode in turn to exhibit a glow discharge over its scan area,*

*said display means including an anode electrode means in operative glow discharge relationship with each of said cathodes and a second conductor means connected to said anode electrode means to increase the current flow therethrough when the scanning of the scan areas reaches said selected cathode,*

*said anode electrode being a transparent conductive coating on the interior surface of said face plate, and the space within said envelope being open along the array between the plane of the display areas of the cathodes and said transparent coating.*

*40. A display panel as in claim 39 wherein said surface divider is formed by an insulating material which extends along the length of the array and crosses each cathode between its scan and display areas.*

*41. A gaseous discharge bar graph display panel in which only one glow cathode in a row is selected and lighted, to provide a visual display of the magnitude of a parameter of a signal being received, comprising*

*an envelope formed of a face plate having a viewing window and a base plate closely spaced thereto,*

*an ionizable gas within said envelope,*

*a single row of glow cathodes disposed along the interior surface of the base plate facing said viewing window,*

*each of said cathodes having a small scan area and a larger display area on its surface, with a surface divider between said scan and display areas,*

*the scan areas of the successive cathodes being aligned with one another all on one side of said surface divider, and the display areas being aligned with one another on the other side,*

*each scan area being in gas communication and glow priming relationship with its associated display area and with the scan area of the next succeeding cathode, so that each scan area, when it glows, primes its associated display area and the scan area of the next succeeding cathode,*

*scanning means for scanning the scan areas of said cathodes one after another, from one end of the row toward the other, and*

*display means for producing a glow discharge along the surface of a selected one of said display areas, at a selected distance from said one end of the row, to represent by such distance a parameter of an input signal being received,*

*said scanning means including first conductor means connected to said cathodes for energizing successive ones of said cathodes one after another, beginning at said one end of the row, and causing each such cathode in turn to exhibit a glow discharge over its scan area,*

*said display means including an anode electrode means in operative glow discharge relationship with each of said cathodes and a second conductor means connected to said anode electrode means to increase the current flow therethrough when the scanning of the scan areas reaches said selected cathode,*

*said anode electrode being a transparent conductive coating on the interior surface of said face plate.*

* * * * *